US012663475B2

(12) United States Patent
Liang et al.

(10) Patent No.: US 12,663,475 B2
(45) Date of Patent: Jun. 23, 2026

(54) METHOD AND APPARATUS FOR ESTIMATING STATE OF CHARGE OF LITHIUM IRON PHOSPHATE BATTERY

(71) Applicant: CONTEMPORARY AMPEREX TECHNOLOGY CO., LIMITED, Ningde (CN)

(72) Inventors: Xu Liang, Ningde (CN); Shichang Zhang, Ningde (CN); Yanmin Xie, Ningde (CN); Zhu Yuan, Ningde (CN); Shan Huang, Ningde (CN); Lei Huang, Ningde (CN); Haili Li, Ningde (CN)

(73) Assignee: CONTEMPORARY AMPEREX TECHNOLOGY CO., LIMITED, Ningde City (CN)

( * ) Notice: Subject to any disclaimer, the term of this patent is extended or adjusted under 35 U.S.C. 154(b) by 0 days.

(21) Appl. No.: 19/295,939

(22) Filed: Aug. 11, 2025

(65) Prior Publication Data

US 2025/0362349 A1 Nov. 27, 2025

Related U.S. Application Data

(63) Continuation of application No. PCT/CN2023/131605, filed on Nov. 14, 2023.

(30) Foreign Application Priority Data

Apr. 19, 2023 (CN) .......................... 202310423730.1

(51) Int. Cl.
*G01R 31/374* (2019.01)
*G01R 31/367* (2019.01)
*G01R 31/3835* (2019.01)

(52) U.S. Cl.
CPC ......... *G01R 31/374* (2019.01); *G01R 31/367* (2019.01); *G01R 31/3835* (2019.01)

(58) Field of Classification Search
CPC ...... G01R 31/374; G01R 31/36; G01R 31/00; G01R 31/367; G01R 31/3835; G01R 31/382
See application file for complete search history.

(56) References Cited

U.S. PATENT DOCUMENTS

| | | | |
|---|---|---|---|
| 6,388,447 B1 | 5/2002 | Hall et al. | |
| 2008/0204031 A1* | 8/2008 | Iwane .................. | G01R 31/389 |
| | | | 324/430 |

(Continued)

FOREIGN PATENT DOCUMENTS

| | | |
|---|---|---|
| CN | 103259055 A | 8/2013 |
| CN | 104036128 A | 9/2014 |

(Continued)

OTHER PUBLICATIONS

ISR for PCT/CN2023/131605 mailed Feb. 18, 2024.

(Continued)

*Primary Examiner* — Mohamed Charioui
(74) *Attorney, Agent, or Firm* — Ladas & Parry, LLP

(57) ABSTRACT

A method and apparatus for estimating a state of charge of a lithium iron phosphate battery are described. The implementation solution of the method for estimating a state of charge of a lithium iron phosphate battery is: acquiring the temperature of the current time period and an SOC-OCV curve under the current of the current time period; determining, on the basis of the state of charge of the SOC-OCV curve, a correction point of the SOC-OCV curve; and correcting, on the basis of a combination of at least one temperature and at least one current, the SOC-OCV curve at the correction point, and updating the SOC-OCV curve.

13 Claims, 5 Drawing Sheets

<u>100</u>

(56) References Cited

U.S. PATENT DOCUMENTS

| | | | |
|---|---|---|---|
| 2018/0299511 A1* | 10/2018 | Kim | G01R 31/367 |
| 2018/0340983 A1* | 11/2018 | Li | G01R 31/3842 |
| 2020/0400750 A1* | 12/2020 | Du | H01M 10/44 |
| 2022/0281350 A1* | 9/2022 | Tang | G01R 31/374 |

FOREIGN PATENT DOCUMENTS

| | | | |
|---|---|---|---|
| CN | 110386029 A | 10/2019 | |
| CN | 110967644 A | 4/2020 | |
| CN | 111781508 A | 10/2020 | |
| CN | 112327174 A | 2/2021 | |
| CN | 113514770 A | 10/2021 | |
| CN | 113933728 A | 1/2022 | |
| CN | 115932586 A | 4/2023 | |
| EP | 4063885 A1 | 9/2022 | |
| JP | 2020112415 A | 7/2020 | |
| KR | 20150019190 A | 2/2015 | |

OTHER PUBLICATIONS

Written Opinion for PCT/CN2023/131605 mailed Feb. 18, 2024.
Extended European search report from corresponding European Patent Application No. 23933814.8 dated Apr. 13, 2028.
Duong Van-Huan et al: "Accurate approach to the temperature effect on state of charge estimation in the LiFePO4 battery under dynamic load operation", Applied Energy., vol. 204, Jul. 25, 2017, pp. 560-571, XP093383071, GB ISSN: 0306-2619, DOI: 10.1016/j. apenergy.2017.07.056.

* cited by examiner

100

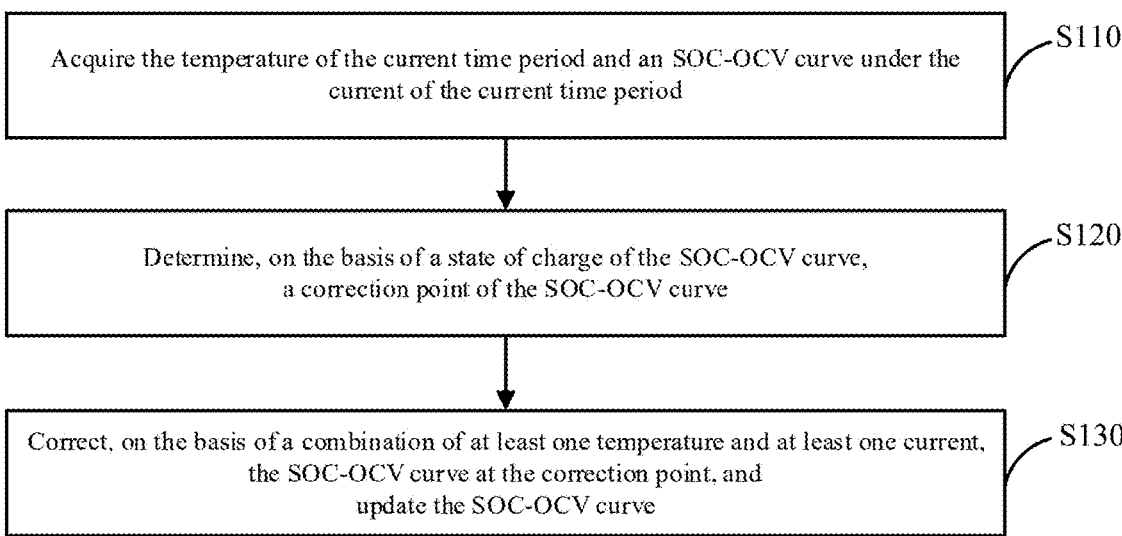

| | |
|---|---|
| Acquire the temperature of the current time period and an SOC-OCV curve under the current of the current time period | S110 |
| Determine, on the basis of a state of charge of the SOC-OCV curve, a correction point of the SOC-OCV curve | S120 |
| Correct, on the basis of a combination of at least one temperature and at least one current, the SOC-OCV curve at the correction point, and update the SOC-OCV curve | S130 |

FIG. 1a

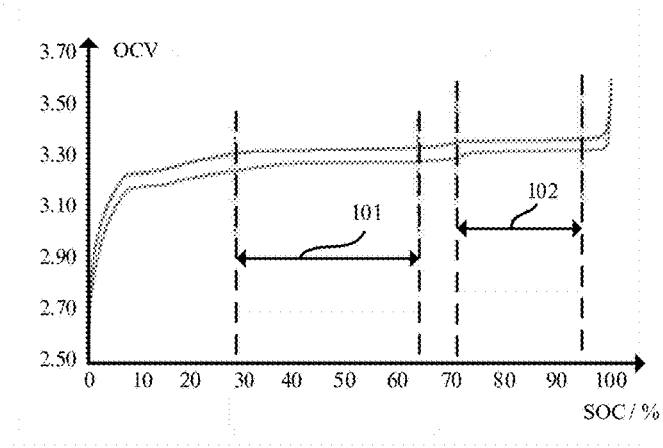

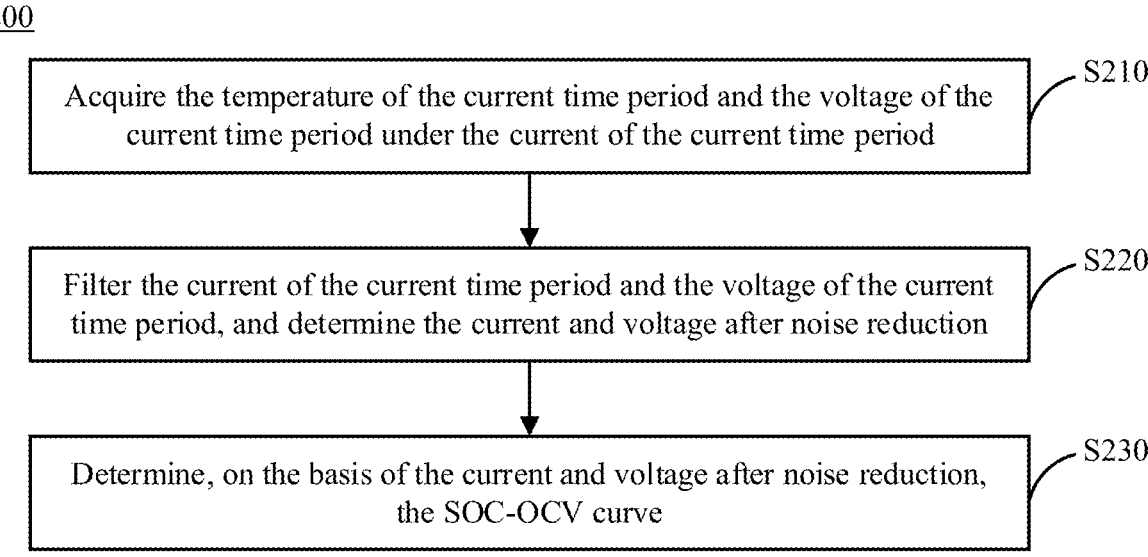

Acquire the temperature of the current time period and the voltage of the current time period under the current of the current time period    S210

Filter the current of the current time period and the voltage of the current time period, and determine the current and voltage after noise reduction    S220

Determine, on the basis of the current and voltage after noise reduction, the SOC-OCV curve    S230

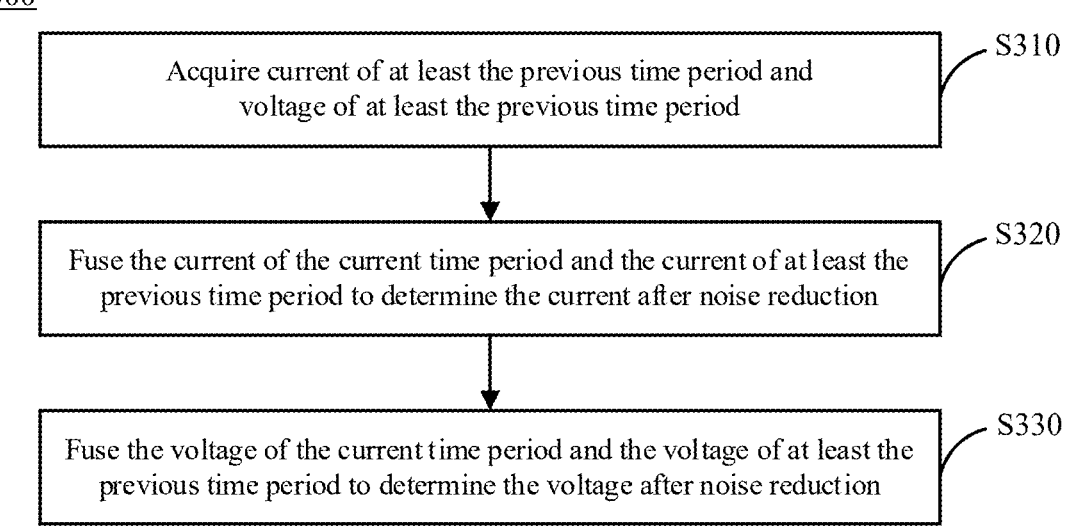

Acquire current of at least the previous time period and voltage of at least the previous time period    S310

Fuse the current of the current time period and the current of at least the previous time period to determine the current after noise reduction    S320

Fuse the voltage of the current time period and the voltage of at least the previous time period to determine the voltage after noise reduction    S330

METHOD AND APPARATUS FOR ESTIMATING STATE OF CHARGE OF LITHIUM IRON PHOSPHATE BATTERY

CROSS-REFERENCE TO RELATED APPLICATIONS

The present application is a continuation of International application PCT/CN2023/131605 filed on Nov. 14, 2023 that claims priority to Chinese Patent Application 202310423730.1, filed on Apr. 19, 2023. The content of these applications is incorporated by reference herein in its entirety.

TECHNICAL FIELD

The present application relates to the technical field of batteries, and particularly relates to a method and an apparatus for estimating a state of charge of a lithium iron phosphate battery, an electronic device, a storage medium and a program product.

BACKGROUND

With energy saving and emission reduction being the key to the sustainable development of the automobile industry, electric vehicles have become an important part of the sustainable development of automotive industry due to their advantages of energy saving and environmental protection. For electric vehicles, the battery technology is an important factor in development.

In recent years, with the rapid development of electric vehicles, lithium batteries have been widely used by virtue of their own advantages. The accuracy of the state of charge of lithium iron phosphate batteries directly affects the working state, service life and safety performance of the batteries, therefore, there is an urgent need for a method for estimating the state of charge of the lithium iron phosphate batteries that can improve the estimation accuracy, which is of great significance to the practical application of lithium iron phosphate batteries.

SUMMARY OF THE INVENTION

The present application aims to solve at least one of the technical problems in the related technology. Therefore, one objective of the present application is to provide a method and an apparatus for estimating a state of charge of a lithium iron phosphate battery, an electronic device, a storage medium and a program product, thus effectively increasing the possibility of correcting the SOC (State of Charge), and improving the estimation precision of the state of charge of the lithium iron phosphate battery.

In a first aspect, an embodiment of the present application provides a method for estimating a state of charge of a lithium iron phosphate battery, and the method includes: acquiring the temperature of the current time period and an SOC-OCV (Open Circuit Voltage) curve under the current of the current time period; determining, on the basis of the state of charge of the SOC-OCV curve, a correction point of the SOC-OCV curve; and correcting, on the basis of a combination of at least one temperature and at least one current, the SOC-OCV curve at the correction point, and updating the SOC-OCV curve.

In the technical solution of the embodiment of the present application, the correction point is determined on the basis of state of charge of the SOC-OCV curve of the lithium iron phosphate battery in the current time period, and the SOC-OCV curve is corrected at the correction point on the basis of the combination of the temperature and current of the current time period, so that the possibility of correcting the SOC can be increased, the estimation precision of the state of charge of the lithium iron phosphate battery is improved, and as a result, the working state, the service life and the safety performance of the battery are ensured.

In some embodiments, the acquiring the temperature of the current time period and an SOC-OCV curve under the current of the current time period includes: acquiring the temperature of the current time period and the voltage of the current time period under the current of the current time period; filtering the current of the current time period and the voltage of the current time period, and determining the current and voltage after noise reduction; and determining, on the basis of the current and voltage after noise reduction, the SOC-OCV curve. By filtering and noise reduction on the current and voltage, the interference in the collected current and voltage data can be reduced, the data can change more smoothly over time, and accordingly the obtained current and voltage data is more accurate, so that the subsequent estimation result of the state of charge of the lithium iron phosphate battery is closer to a true value.

In some embodiments, the filtering the current of the current time period and the voltage of the current time period, and determining the current and voltage after noise reduction includes: acquiring current of at least the previous time period and voltage of at least the previous time period; fusing the current of the current time period and the current of at least the previous time period to determine the current after noise reduction; and fusing the voltage of the current time period and the voltage of at least the previous time period to determine the voltage after noise reduction. The current and the voltage of at least one time period previous to the current time period are fused, which further avoids the disturbance of high-frequency signals and pulse signals to the fitting result of the SOC-OCV curve, makes the data change more smoothly over time, and thus the subsequent estimation result of the state of charge of the lithium iron phosphate battery is closer to the true value, and the robustness and accuracy of SOC correction can be enhanced.

In some embodiments, the determining, on the basis of the state of charge of the SOC-OCV curve, a correction point of the SOC-OCV curve includes: differentiating the SOC-OCV curve to determine a voltage differentiation curve; and determining, on the basis of a voltage differentiation peak of the voltage differentiation curve in a preset state of charge interval, the correction point. By differentiating the SOC-OCV curve, the voltage differentiation peak of the voltage differentiation curve can be acquired in the preset state of charge interval, thus, the corresponding correction point can be identified accurately on the basis of the voltage differentiation peak in a platform area of the SOC-OCV curve, then the state of charge (SOC) can be corrected in the platform area of the SOC-OCV curve, and the possibility of correction is increased, thereby improving the estimation accuracy of SOC.

In some embodiments, the differentiating the SOC-OCV curve to determine a voltage differentiation curve includes: acquiring a fixed voltage increment and a time increment corresponding to the fixed voltage increment; and differentiating, on the basis of the fixed voltage increment and the time increment, the SOC-OCV curve to determine the voltage differentiation curve. The SOC-OCV curve of the lithium iron phosphate battery is differentiated to obtain the corresponding voltage differentiation curve, so that a point with large voltage distinction degree can be acquired in a large platform area range in the middle section, and it is taken as the time for correcting the SOC of a battery, so as to realize dynamic correction of the SOC.

In some embodiments, the preset state of charge interval includes a first state of charge interval under a first platform area, the correction point includes a first correction point, and the first platform area is a continuous area with a voltage differentiation value less than a first preset value in the voltage differentiation curve; and the determining, on the basis of the voltage differentiation peak of the voltage differentiation curve in a preset state of charge interval, the correction point includes: determining, on the basis of the position of a first voltage differentiation peak in the first state of charge interval, the first correction point in the first state of charge interval. The point with the maximum voltage differentiation value in the first state of charge interval is determined as the first correction point, and then the correction value can be determined at the position with the voltage distinction degree as large as possible, thereby improving the correction accuracy.

In some embodiments, the correcting, on the basis of a combination of at least one temperature and at least one current, the SOC-OCV curve at the correction point, and updating the SOC-OCV curve includes: calibrating, on the basis of the combination of at least one temperature and at least one current, a first correction value of the SOC-OCV curve at the first correction point; and updating, on the basis of the first correction value, the SOC-OCV curve. By correcting the SOC-OCV curve on the basis of the first correction point in the first state of charge interval, the correction value can be determined at the position with the voltage distinction degree as large as possible, thereby improving the accuracy of correction.

In some embodiments, the preset state of charge interval includes a second state of charge interval between the first platform area and a second platform area, the correction point includes a second correction point, and the second platform area is a continuous area with a voltage differentiation value less than a second preset value in the voltage differentiation curve; and the determining, on the basis of the voltage differentiation peak of the voltage differentiation curve in a preset state of charge interval, the correction point includes: determining, on the basis of the position of the second voltage differentiation peak in the second state of charge interval, the second correction point in the second state of charge interval. For two platform sections of the platform area of the SOC-OCV curve, the voltage differentiation peak of the voltage differentiation curve between the two platform sections is determined as the second correction point, and an effective correction point can be further added at the position with the voltage distinction degree as large as possible, thereby improving the correction accuracy.

In some embodiments, the correcting, on the basis of a combination of at least one temperature and at least one current, the SOC-OCV curve at the correction point, and updating the SOC-OCV curve includes: calibrating, on the basis of the combination of at least one temperature and at least one current, a second correction value of the SOC-OCV curve at the second correction point; and updating, on the basis of the second correction value, the SOC-OCV curve. By correcting the SOC-OCV curve on the basis of second first correction point in the second state of charge interval, an effective correction point can be further added at the position with the voltage distinction degree as large as possible, thereby improving the correction accuracy.

In some embodiments, the method for estimating a state of charge of a lithium iron phosphate battery further includes: determining, on the basis of the temperature of the current time period and the current of the current time period, an SOC value corresponding to the current voltage in the updated SOC-OCV curve. By determining the SOC value corresponding to the current voltage in the updated SOC-OCV curve, the estimated state of charge of the lithium iron phosphate battery in the current time period can be closer to the true value, and thus, the use safety and service life of the battery can be improved and prolonged.

In a second aspect, an embodiment of the present application provides an apparatus for estimating a state of charge of a lithium iron phosphate battery, and the apparatus includes: an acquisition module configured to acquire the temperature of the current time period and an SOC-OCV curve under the current of the current time period; a calculation module configured to determine, on the basis of the state of charge of the SOC-OCV curve, a correction point of the SOC-OCV curve; and a correction module configured to correct, on the basis of a combination of at least one temperature and at least one current, the SOC-OCV curve at the correction point, and update the SOC-OCV curve.

In the technical solution of the embodiment of the present application, the correction point is determined on the basis of state of charge of the SOC-OCV curve of the lithium iron phosphate battery in the current time period, and the SOC-OCV curve is corrected at the correction point on the basis of the combination of the temperature and current of the current time period, so that the possibility of correcting the SOC can be increased, the estimation precision of the state of charge of the lithium iron phosphate battery is improved, and as a result, the working state, the service life and the safety performance of the battery are ensured.

In some embodiments, the acquisition module includes: an acquisition module configured to acquire the temperature and the voltage under the current; a filter unit configured to filter the current and the voltage to obtain the current and voltage after noise reduction; and a fitting unit configured to obtain the SOC-OCV curve according to the basis of the current and voltage after noise reduction.

In some embodiments, the acquisition unit is further configured to acquire current of at least the previous time period and voltage of at least the previous time period; and the filter unit is further configured to fuse the current of the current time period and the current of at least the previous time period to determine the current after noise reduction, and fuse the voltage of the current time period and the voltage of at least the previous time period to determine the voltage after noise reduction.

In some embodiments, the calculation module includes: a differentiating unit configured to differentiate the SOC-OCV curve to determine a voltage differentiation curve; and a determination unit configured to determine, on the basis of the voltage differentiation peak of the voltage differentiation curve in a preset state of charge interval, the correction point.

In some embodiments, the differentiating unit is further configured to acquire a fixed voltage increment and a time increment corresponding to the fixed voltage increment, and differentiate, on the basis of the fixed voltage increment and the time increment, the SOC-OCV curve to determine the voltage differentiation curve.

In some embodiments, the preset state of charge interval includes a first state of charge interval under a first platform area, the correction point includes a first correction point, and the first platform area is a continuous area with a voltage differentiation value less than a first preset value in the voltage differentiation curve; and the determination unit is further configured to determine, on the basis of the position of a first voltage differentiation peak in the first state of charge interval, the first correction point in the first state of charge interval.

In some embodiments, the correction module is further configured to calibrate, on the basis of the combination of at least one temperature and at least one current, a first correction value of the SOC-OCV curve at the first correction point, and update, on the basis of the first correction value, the SOC-OCV curve.

In some embodiments, the preset state of charge interval includes a second state of charge interval between the first platform area and a second platform area, the correction point includes a second correction point, and the second platform area is a continuous area with a voltage differentiation value less than a second preset value in the voltage differentiation curve; and the determination unit is further configured to determine, on the basis of the position of the second voltage differentiation peak in the second state of charge interval, the second correction point in the second state of charge interval.

In some embodiments, the correction module is further configured to calibrate, on the basis of the combination of at least one temperature and at least one current, a second correction value of the SOC-OCV curve at the second correction point; and update, on the basis of the second correction value, the SOC-OCV curve.

In some embodiments, the apparatus for estimating a state of charge of a lithium iron phosphate battery further includes: an output module configured to determine, on the basis of the temperature of the current time period and the current of the current time period, an SOC value corresponding to the current voltage in the updated SOC-OCV curve.

In a third aspect, an embodiment of the present application provides an electronic device which includes a memory and a processor, in which, the memory is configured to store computer programs which can run in a processor, and the processor executes the programs to implement the method in any one of the above embodiments.

In a fourth aspect, an embodiment of the present application provides a computer-readable storage medium on which a computer program is stored, and the computer program is executed by a processor to implement the method in any one of the above embodiments.

In a fifth aspect, an embodiment of the present application provides a computer program product which includes a computer-readable code, or a nonvolatile computer-readable storage medium carrying the computer-readable code; and when the computer-readable code runs in an electronic device, a processor in the electronic device implements the method in any one of the above embodiments.

The above description is only an overview of the technical solution of the present application, and in order to be able to understand more clearly the technical means of the present application, it can be implemented in accordance with the contents of the description, and in order to make the above and other purposes, characteristics and advantages of the present application more obvious and easy to understand, the specific embodiments of the present application are listed below.

DESCRIPTION OF DRAWINGS

In the drawings, unless otherwise specified, like reference numerals indicate like or similar parts or elements throughout multiple drawings. These drawings are not necessarily drawn to scale. It is to be understood that these accompanying drawings merely depict some embodiments disclosed by the present application and should not be regarded as limiting the scope of the present application. In order to more clearly illustrate the technical solution of the embodiments of the present application, the drawings that need to be used in the embodiments of the present application will be briefly introduced below, and it is obvious that the drawings described below are only some embodiments of the present application, and for those skilled in the art, other drawings can also be obtained according to the drawings without paying creative labor.

FIG. 1a is a flowchart of a method for estimating a state of charge of a lithium iron phosphate battery according to an embodiment of the present application;

FIG. 1b is a schematic diagram of an SOC-OCV curve of a lithium iron phosphate battery according to an embodiment of the present application;

FIG. 2 is a flowchart of a process of acquiring an SOC-OCV curve according to an embodiment of the present application;

FIG. 3 is a flowchart of a process of filtering and noise reduction according to an embodiment of the present application;

DETAILED DESCRIPTION

Figure 4:
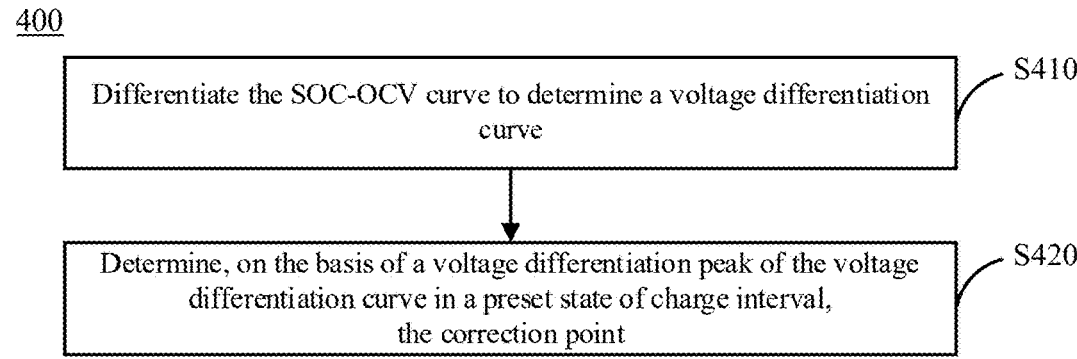
FIG. 4 is a flowchart of a process of determining a correction point according to an embodiment of the present application.

Embodiments of the technical solutions of the present application will be described in detail below with reference to the accompanying drawings. The following embodiments are only used for more clearly illustrating the technical solution of the present application and are therefore only examples and not to limit the scope of protection of the present application.

Unless otherwise defined, all technical and scientific terms used herein have the same meanings as generally understood by those skilled in the art of the present application; the terms used herein are intended only to describe specific embodiments and are not intended to limit the present application; and the terms "including" and "having" and any variations thereof in the description and claims of the present application and in the foregoing description of the accompanying drawings and in the description thereof, and any variations thereof, are intended to cover non-exclusive inclusions.

In the description of the embodiments of the present application, the technical terms "first", "second", etc., are only used for distinguishing different objects, and cannot be understood as indicating or implying relative importance or implying the number, specific order or primary and secondary relationship of the technical features indicated. In the description of the embodiments of the present application, the meaning of "a plurality of" is two or more, unless otherwise explicitly and specifically defined.

Reference herein to "an embodiment" means that a particular feature, structure, or characteristic described in connection with the embodiment can be included in at least one embodiment of the present application. The appearance of this phrase in various places in the specification does not necessarily refer to the same embodiment, nor is it a separate or alternative embodiment that is mutually exclusive with other embodiments. It is explicitly and implicitly understood by those skilled in the art that the embodiments described herein may be combined with other embodiments.

In the description of the embodiments of the present application, the term "and/or" is simply a description of an association of associated objects, which indicates that there may exist three relationships, for example, A and/or B may represent three situations: A exists alone, both A and B exist, and B exists alone. Moreover, the character "/" herein generally indicates that the context objects are in an "or" relationship.

In the description of the embodiments of the present application, the term "a plurality of" refers to two or more (including two), and similarly, "a plurality of groups" refers to two or more (including two) groups, and "a plurality of sheets" refers to two or more (including two) sheets.

In the description of the embodiments of the present application, the technical terms "center", "longitudinal", "transverse", "length", "width", "thickness", "upper", "lower", "front", "rear", "left", "right", "vertical", "horizontal", "top", "bottom", "inner", "outer", "clockwise", "counterclockwise", "axial", "radial", "circumferential" and the like which indicate the orientation or positional relationship are based on the orientation or positional relationship shown in the accompanying drawing, and are only for the convenience of describing the embodiments of the present application and simplifying the description, and do not indicate or imply that the device or element referred to must have a specific orientation, be constructed and operated in a specific orientation, and therefore cannot be construed as a restriction on the embodiments of the present application.

In the description of the embodiments of the present application, unless otherwise expressly specified or limited, the technical terms "mounted", "linked", "connected", "fixed" and other terms shall be understood broadly, for example, they may be fixed, detachable, or integral, or mechanically or electrically connected, or directly linked, or indirectly linked through an intermediate medium, and may be communicated internally or interacted between two elements. For those of ordinary skill in the art, the specific meaning of the above terms in the present application may be understood on a case-by-case basis.

At present, from the perspective of the development of the market situation, power batteries are increasingly more widely used. Power batteries are not only applied in energy storage power source systems such as water, fire, wind and solar power stations, but also widely applied in electric transport tools, such as electric bicycles, electric motorcycles, and electric vehicles, as well as many fields, such as military equipment and aerospace. With the continuous expansion of the application field of power batteries, the demand in the market is also constantly expanding.

Lithium-ion batteries (or lithium batteries for short) have been widely used in a variety of electrical products due to their advantages of high energy density, long cycle life, and no memory effect. The electrical product can be but not limited to mobile phones, tablet computers, notebook computers, electric toys, electric tools, electric vehicles, electric automobiles, ships, spacecraft and the like.

In recent years, with the rapid development of electric vehicles, lithium iron phosphate batteries have been widely used by virtue of their own advantages, and the accuracy of the state of charge of the batteries in the application directly affects the working state, service life and safety performance of the batteries. However, due to the characteristics of platform areas of the lithium iron phosphate batteries, there are less possibility for correcting the state of charge. Especially when applied to hybrid vehicles, the state of charge of the lithium iron phosphate batteries is generally in the service range of 30%-80%, and the calculation to the state of charge in this interval basically depends entirely on ampere-hour integrals. Therefore, in the process of estimating the state of charge of the lithium iron phosphate batteries, how to improve the estimation accuracy of the state of charge of the lithium iron phosphate batteries has become a problem to be urgently solved.

In order to correct the state of charge of the lithium iron phosphate batteries, the maximum cell voltage can reach an upper limit of the battery service voltage at the end of charging, and therefore, after a period of time, the state of charge of the lithium iron phosphate batteries at this time can be accurately calibrated to be 100%, accordingly the state of charge of the lithium iron phosphate batteries is corrected, and this method is also called full charge correction for the battery. However, in this method, there is only one chance to correct the state of charge of the lithium iron phosphate batteries, and at the end of the charging process, it is not possible to make a good correction for the general range of the state of charge of the lithium iron phosphate batteries, i.e., the range of 30%-80%, so the accuracy is not high.

In other cases, the state of charge of the lithium iron phosphate batteries can also be corrected by querying an SOC-OCV table with the current open circuit voltage, which is also known as static correction for the batteries, because the open circuit voltage used in correcting of the state of charge is a unit voltage value acquired after the batteries stand for 1 to 3 h. However, when the state of charge of lithium iron phosphate batteries is in its general service range, that is, in the range of 30%-80%, the OCV does not change significantly with SOC, that is, the possibility of static correction for the lithium iron phosphate batteries is basically only outside the general service range. Therefore, this method does not improve the estimation accuracy very well.

In yet other cases, the state of charge of the lithium iron phosphate batteries can also be corrected by the current temperature, current and voltage, which is also known as dynamic correction for the batteries. However, due to the characteristics of the SOC-OCV curve of the lithium iron phosphate batteries, this method cannot achieve the correction to the state of charge in the general service range, that is, the range of 30%-80%, so the estimation accuracy in this method is still very limited.

For the general service interval of the state of charge of a lithium iron phosphate battery, it is difficult to utilize the methods of full charge correction, static correction and dynamic correction to correct the state of charge of the lithium iron phosphate battery, and the estimation to the state of charge almost completely depends on a current sensor, so the cumulative deviation of the state of charge is increasing day by day, and as a result, the problem of falsely high or falsely low state of charge will be caused over time. If the state of charge is falsely high, it may cause the vehicle to break down and have insufficient range while running. If the state of charge is falsely low, it will affect the safety of the batteries in use, which may increase the risk of lithium separation of the batteries, thereby causing the safety accident of the batteries. Therefore, there is an urgent need for a method for estimating the state of charge of the lithium iron phosphate batteries that can improve the estimation accuracy.

On the basis of this, an embodiment of the present application provides the method for estimating a state of charge of a lithium iron phosphate battery, a correction point is determined on the basis of state of charge of an SOC-OCV curve of the lithium iron phosphate battery in the current time period, and the SOC-OCV curve is corrected at the correction point on the basis of a combination of the temperature and current of the current time period, so that the possibility of correcting the SOC can be increased, the estimation precision of the state of charge of the lithium iron phosphate battery is improved, and as a result, the working state, the service life and the safety performance of the battery are ensured.

In one aspect, the present application provides the method for estimating a state of charge of a lithium iron phosphate battery.

FIG. 1a shows a method 100 for estimating a state of charge of a lithium iron phosphate battery according to an embodiment of the present application. As shown in FIG. 1a, the method 100 for estimating a state of charge of a lithium iron phosphate battery includes: step S110, acquiring the temperature of the current time period and an SOC-OCV curve under the current of the current time period; step S120, determining, on the basis of the state of charge of the SOC-OCV curve, a correction point of the SOC-OCV curve; and step S130, correcting, on the basis of a combination of at least one temperature and at least one current, the SOC-OCV curve at the correction point, and updating the SOC-OCV curve.

Step S110: Acquire the temperature of the current time period and an SOC-OCV curve under the current of the current time period.

FIG. 1b shows an SOC-OCV curve of a lithium iron phosphate battery according to an embodiment of the present application. The SOC-OCV curve is a curve representing that the open circuit voltage (or voltage for short) of the lithium iron phosphate battery changes with the state of charge of the lithium iron phosphate battery under specific temperature and current conditions, the state of charge of the SOC-OCV curve is the horizontal axis, and the open circuit voltage is the vertical axis.

In an example, the SOC-OCV curve acquired in step S110 can be the SOC-OCV curve shown in FIG. 1b.

As shown in FIG. 1b, the SOC-OCV curve of the lithium iron phosphate battery has a large slope at the left and right ends, that is, when the state of charge of the battery is very small and close to 100%, the voltage changes very obviously with the state of charge of the battery. In a middle area, especially in the part with the SOC of 10-99%, the curve is very gentle, namely, the voltage changes not obviously with the state of charge of the battery in this area. The gentle middle area in the SOC-OCV curve of the lithium iron phosphate battery can also be called as a platform area. As described above, the general service range of the state of charge of the lithium iron phosphate battery used in an electric vehicle is 30-80%, that is, the general service range of the state of charge of the lithium iron phosphate battery used in the electric vehicle is within the platform area of the SOC-OCV curve of the lithium iron phosphate battery.

After research, the applicant found that in the platform area of the SOC-OCV curve of the lithium iron phosphate battery, the curve has different slope at each point. In the example illustrated in FIG. 1a, the area with the SOC of 30% to 65% and the area with the SOC of 75% to 95% are particularly gentle parts in the platform area in the SOC-OCV curve of the lithium iron phosphate battery, so the area with the SOC of 30% to 65% can be called a first platform area 101, and the area with the SOC of 75% to 95% is called a second platform area 102. In some embodiments, the first platform area 101 and the second platform area 102 may be continuous areas with slope less than a certain preset value, and the preset value may be very close to 0.

It is to be understood that FIG. 1b only shows the SOC-OCV curve of the lithium iron phosphate battery as one example, two curves in FIG. 1b may be, for example, the corresponding SOC-OCV curves of the lithium iron phosphate battery charged and discharged at a charging rate of 0.005C at room temperature, the curve with the platform area at the upper portion corresponds to the SOC-OCV curve in charging, and the other curve is the SOC-OCV curve in discharging. The SOC-OCV curves of the lithium iron phosphate battery may be different at different temperatures and currents, but the approximate shapes and trends of these SOC-OCV curves may be similar, for example, both changing significantly at both ends and being gentle in the middle section of the curves, forming a large platform area. This feature may be determined by the characteristics of the lithium iron phosphate battery.

Step S120: Determine, on the basis of the state of charge of the SOC-OCV curve, a correction point of the SOC-OCV curve.

In an example, the correction point of the SOC-OCV curve may be determined on the basis of the voltage value of the SOC-OCV curve. When determining, on the basis of the voltage value of the SOC-OCV curve at the state of charge of 100%, the correction point of the SOC-OCV curve, the battery may stand for a period of time (for example, 1 to 3 h) after being fully charged, and then the voltage value is acquired to determine the correction point of the SOC-OCV curve. When determining, on the basis of the voltage value of the SOC-OCV curve at the state of charge of 0 to 10% or 99% to 100%, the correction point of the SOC-OCV curve, the battery at this state of charge may stand for a period of time (for example, 1 to 3 h), and then an actual voltage value is acquired and accordingly the correction point of the SOC-OCV curve is determined.

In an example, during determining, on the basis of the voltage value of the SOC-OCV curve at the state of charge of the platform area, the correction point of the SOC-OCV, differential processing can be performed on the SOC-OCV curve, for example, dividing a fixed voltage increment by a time increment corresponding to the fixed voltage increment to acquire an SOC-Voltage differentiation curve, and selecting a specific point in the SOC-Voltage differentiation curve as the correction point of the SOC-OCV curve to correct the SOC-OCV curve. The specific point may be, for example, a voltage differentiation extreme point, a peak point or the maximum value point in the SOC-Voltage differentiation curve.

Before performing differential processing on the SOC-OCV curve to acquire the SOC-Voltage differentiation curve, the voltage can be subjected to filtering processing, such as low-pass filtering. After the voltage is filtered, the robustness of a voltage model will be improved, and the accuracy of the specific point obtained in the SOC-Voltage differentiation curve can be increased, which is conducive to the correction to the SOC-OCV curve, and therefore, a more accurate estimation result of the state of charge of the lithium iron phosphate battery can be obtained.

On the basis of the same reason, the current can also be subjected to filtering processing, such as low-pass filtering. When querying an SOC correction table on the basis of a combination of temperature and current, a relationship between the voltage and the SOC can be obtained according to the current temperature and current value, and thus the current subjected to filtering processing is more stable and accurate, which is conducive to obtaining more accurate relationship between the voltage and the SOC.

Step S130: Correct, on the basis of a combination of at least one temperature and at least one current, the SOC-OCV curve at the correction point, and update the SOC-OCV curve.

In an example, the correction to the SOC-OCV curve at the correction point may be in accordance with the SOC correction table on the basis of the combination of temperature and current of the lithium iron phosphate battery. For example, the lithium iron phosphate battery can be tested on the basis of different combinations of temperature and current to obtain the SOC corresponding to each combination of temperature and current, and thus the SOC correction table on the basis of the combination of temperature and current is constructed. Therefore, the corrected SOC corresponding to the correction point can be queried from the SOC correction table on the basis of the combination of at least one temperature and at least one current of the current time period, and the SOC-OCV curve is updated on the basis of the corrected SOC.

In an example, one correction point can be determined (such as the maximum voltage differentiation value point in the platform area with the SOC of 10% to 99%), or a plurality of correction points can be determined (such as a point corresponding to a voltage differentiation peak of an area on the left side of the first platform area shown in FIG. 1 in the platform area with the SOC of 10% to 99%, and a point corresponding to a voltage differentiation peak of an area between the first platform area and the second platform area). Correspondingly, the operation of correcting and updating the SOC-OCV curve can be carried out once or a plurality of times.

It is to be understood that a plurality of correction points are determined in the SOC-OCV curve of the lithium iron phosphate battery, that is, in a case of correcting the SOC-OCV curve for a plurality of times, the SOC-OCV curve obtained by the last update is more consistent with the true value than the SOC-OCV curve that is corrected for a single time on the basis of the determined single correction point.

According to the method for estimating a state of charge of a lithium iron phosphate battery in the embodiment of the present application, the correction point is determined on the basis of state of charge of the SOC-OCV curve of the lithium iron phosphate battery in the current time period, and the SOC-OCV curve is corrected at the correction point on the basis of the combination of the temperature and current of the current time period, so that the possibility of correcting the SOC can be increased, the estimation precision of the state of charge of the lithium iron phosphate battery is improved, and as a result, the working state, the service life and the safety performance of the battery are ensured.

The following further describes various aspects of the method for estimating a state of charge of a lithium iron phosphate battery according to the embodiment of the present application.

FIG. 2 is a flowchart of a process 200 of acquiring an SOC-OCV curve according to an embodiment of the present application. As shown in FIG. 2, the process 200 of acquiring the SOC-OCV curve may include S210: acquiring the temperature of the current time period and the voltage of the current time period under the current of the current time period; S220, filtering the current of the current time period and the voltage of the current time period, and determining the current and voltage after noise reduction; and S230: determining, on the basis of the current and voltage after noise reduction, the SOC-OCV curve. The process 200 of acquiring the SOC-OCV curve can be, for example, in combination with step S110 shown in FIG. 1a.

Step S210: Acquire the temperature of the current time period and the voltage of the current time period under the current of the current time period.

In an example, the temperature, current and voltage (which can be the open circuit voltage) of each time point can be acquired at a plurality of time points in a continuous time period, for example, the temperature, current and voltage of the lithium iron phosphate battery at each sampling time point can be acquired at a fixed sampling frequency in the whole time period from charging to full charging of the lithium iron phosphate battery when the state of charge is 0.

Step S220: Filter the current of the current time period and the voltage of the current time period, and determine the current and voltage after noise reduction.

In an example, the current and voltage of each of the plurality of time points in the continuous time period can be filtered. The filtering mode can be low-pass filtering, high-pass filtering, band-pass filtering or other common filtering modes. In some embodiments, the current and voltage can be filtered by the low-pass filtering mode.

Step S230: Determine, on the basis of the current and voltage after noise reduction, the SOC-OCV curve.

In an example, for example, the SOC-OCV curve can be calculated in combination with ampere-hour integrals to obtain the SOC-OCV curve.

It is to be understood that in the process of filtering and noise reduction on the current and voltage, the sequence of filtering and noise reduction to current and voltage is not limited. For example, the current can be subjected to filtering and noise reduction, and then the voltage is subjected to filtering and noise reduction; or, the voltage can be subjected to filtering and noise reduction, and then the current is subjected to filtering and noise reduction; and in addition, the current and voltage can be synchronously subjected to filtering and noise reduction.

According to this embodiment of the present application, in the process of acquiring the SOC-OCV curve, by filtering and noise reduction on the current and voltage, the interference in the collected current and voltage data can be reduced, thus the data can change more smoothly over time, and accordingly the obtained current and voltage data is more accurate, and as a result, the subsequent estimation result of the state of charge of the lithium iron phosphate battery is closer to the true value.

FIG. 3 is a flowchart of a process 300 of filtering and noise reduction according to an embodiment of the present application. As shown in FIG. 3, the process 300 of filtering and noise reduction includes S310: acquiring current of at least the previous time period and voltage of at least the previous time period; S320: fusing the current of the current time period and the current of at least the previous time period to determine the current after noise reduction; and S330, fusing the voltage of the current time period and the voltage of at least the previous time period to determine the voltage after noise reduction. The process 300 of filtering and noise reduction can be, for example, in combination with step S220 shown in FIG. 2.

Step S310: Acquire current of at least the previous time period and voltage of at least the previous time period.

In an example, for each of a plurality of time points in a continuous time period, the current and voltage corresponding to at least one previous sampling point can be determined as the current of at least the previous time period and the voltage of at least the previous time period in the step respectively. In some embodiments, for example, the current and voltage corresponding to the previous sampling point can be acquired.

Step S320: Fuse the current of the current time period and the current of at least the previous time period to determine the current after noise reduction.

In an example, the current of the current time period and the current of the previous time period can be fused on the basis of a current filter formula $I(k)=e*I(k)+(1-e)*I(k-1)$. In which, I refers to current, k refers to current time sequence characteristic, and e refers to a weight coefficient and represents the weight proportion of the current of the current time and the current of the previous time in the fusion process. For example, the weight coefficient e can be 0.5, and in this case, the current of the current time period and the current of the previous time period are averaged. The value of e can be determined and adjusted according to the actual situation, which is not limited here. In some embodiments, the value of the weight coefficient e can be, for example, 0.9.

In addition, it is to be further noted that in the process of filtering and noise reduction, the current of a plurality of time periods previous to the current time period can be fused, thus the influence of high-frequency signals and pulse signals can be eliminated, the voltage curve can be smoother, and as a result, the robustness and accuracy of SOC correction can be enhanced.

Step S330: Fuse the voltage of the current time period and the voltage of at least the previous time period to determine the voltage after noise reduction.

Similar to the process of filtering and noise reduction on current, the voltage of the current time period and the voltage of the previous time period can be fused on the basis of a voltage filter formula $V(k)=f*V(k)+(1-f)*V(k-1)$. In which, V refers to voltage, k refers to current time sequence characteristic, and f refers to a weight coefficient and represents the weight proportion of the voltage of the current time and the voltage of the previous time in the fusion process. For example, the weight coefficient f can be 0.5, and in this case, the voltage of the current time period and the voltage of the previous time period are averaged. The value of f can be determined and adjusted according to the actual situation, which is not limited here. In some embodiments, the value of the weight coefficient f can be, for example, 0.9.

It is also to be further noted that in the process of filtering and noise reduction, the voltage of a plurality of time periods previous to the current time period can be fused, thus the influence of the high-frequency signals and the pulse signals can be eliminated, the voltage curve can be smoother, and the robustness and accuracy of SOC correction can be enhanced.

According to this embodiment of the present application, in the process of filtering and noise reduction, the current and the voltage of at least one time period previous to the current time period are fused, thus the disturbance of the high-frequency signals and the pulse signals to the fitting result of the SOC-OCV curve can be further avoided, and the data changes more smoothly over time, the subsequent estimation result of the state of charge of the lithium iron phosphate battery is closer to the true value, thereby enhancing the robustness and accuracy of SOC correction.

FIG. 4 is a flowchart of a process 400 of determining a correction point according to an embodiment of the present application. As shown in FIG. 4, the process 400 of determining the correction point may include S410: differentiating the SOC-OCV curve to determine a voltage differentiation curve; and S420: determining, on the basis of the voltage differentiation peak of the voltage differentiation curve in a preset state of charge interval, the correction point. The process 400 of determining the correction point can be, for example, in combination with step S120 shown in FIG. 1a.

Step S410: Differentiate the SOC-OCV curve to determine a voltage differentiation curve.

In an example, the SOC-OCV curve of the lithium iron phosphate battery shown in FIG. 1b can be differentiated. The differentiation can be implemented by differentiating the voltage to time.

Step S420: Determine, on the basis of the voltage differentiation peak of the voltage differentiation curve in a preset state of charge interval, the correction point.

In an example, the preset state of charge interval can be the general service range of the SOC of the lithium iron phosphate battery used in the electric vehicle, namely, 30% to 80%, and can also be the platform area of the SOC-OCV curve of the lithium iron phosphate battery, such as a part of 10% to 99% in the SOC-OCV curve of the lithium iron phosphate battery shown in FIG. 1b. According to actual needs, the preset state of charge interval can be set to be a less or larger interval range, which is not limited here.

In an example, the voltage differentiation peak can be the maximum point of the voltage differentiation value in the continuous area with the maximum voltage differentiation value change amplitude in the voltage differentiation curve.

According to the embodiment of the present application, in the process of determining the correction point, by differentiating the SOC-OCV curve, the voltage differentiation peak of the voltage differentiation curve can be acquired in the preset state of charge interval, thus, the corresponding correction point can be identified accurately on the basis of the voltage differentiation peak in the platform area of the SOC-OCV curve, accordingly the state of charge (SOC) can be corrected in the platform area of the SOC-OCV curve, the possibility of correction is increased, and the estimation accuracy of SOC is improved.

Figure 5A:
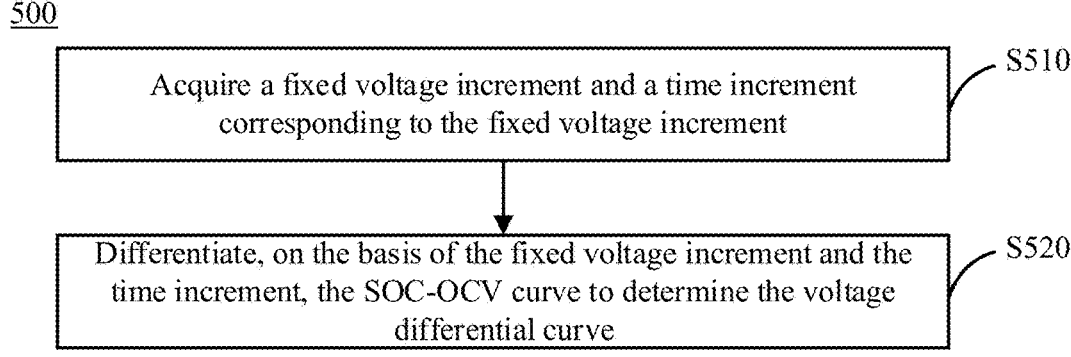
FIG. 5a is a flowchart of a process of determining a voltage differentiation curve according to an embodiment of the present application.

FIG. 5a is a flowchart of a process 500 of determining a voltage differentiation curve according to an embodiment of the present application. As shown in FIG. 5a, the process 500 of determining the voltage differentiation curve may include S510: acquiring a fixed voltage increment and a time increment corresponding to the fixed voltage increment; and S520: differentiating, on the basis of the fixed voltage increment and the time increment, the SOC-OCV curve to determine the voltage differentiation curve. The process 500 of determining the voltage differentiation curve can be, for example, in combination with step S410 shown in FIG. 4.

Step S510: Acquire a fixed voltage increment and a time increment corresponding to the fixed voltage increment.

In an example, the fixed voltage increment can be a preset small voltage value, such as 5 mV (millivolt).

Step S520: Differentiate, on the basis of the fixed voltage increment and the time increment, the SOC-OCV curve to determine the voltage differentiation curve.

In an example, the voltage differentiation value VCR can be calculated according to a voltage differentiation formula VCR (k)=$\Delta V/\Delta t$. In which, $\Delta V$ refers to the fixed voltage increment, and $\Delta t$ refers to the time increment corresponding to the fixed voltage increment $\Delta V$. $\Delta V$ can be, for example, but not limited to 5 mV, and $\Delta t$ represents a time change value when the voltage changes by 5 mV. It is to be understood that the value of $\Delta V$ can be determined or adjusted according to the actual situation, which is not limited here.

Figure 5B:
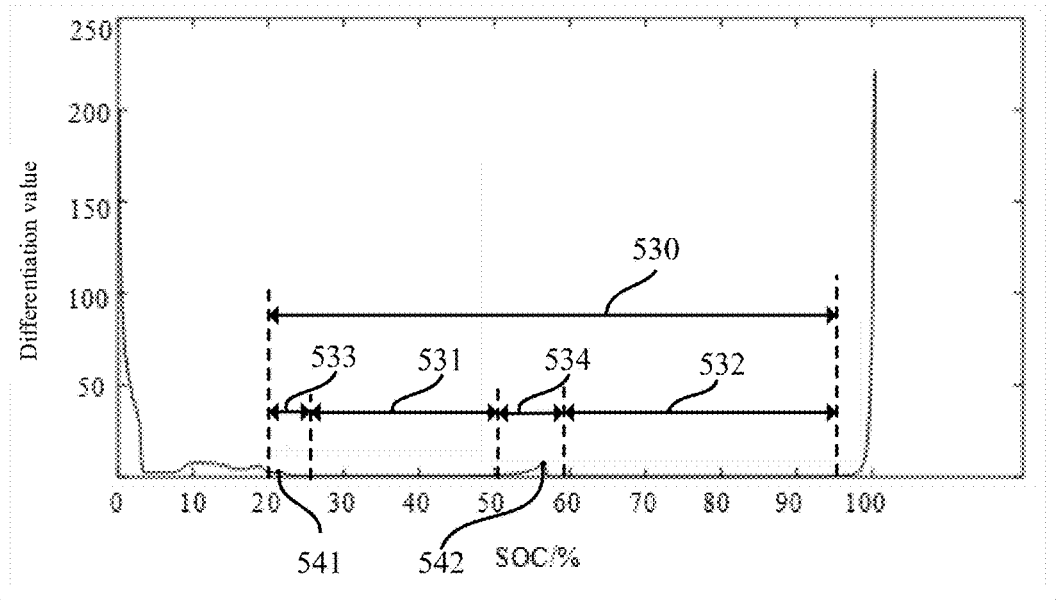
FIG. 5b is a schematic diagram of a voltage differentiation curve of a lithium iron phosphate battery according to an embodiment of the present application.

FIG. 5b shows a voltage differentiation curve of a lithium iron phosphate battery according to an embodiment of the present application In an example, the voltage differentiation value can be calculated by means of above fixed voltage algorithm, and the voltage differentiation value is re-fitted into the voltage differentiation curve which can be shown in FIG. 5b. The voltage differentiation curve shown in FIG. 5b can be obtained by performing differential processing on the SOC-OCV curve shown in FIG. 1b.

In an example, the gentle middle area, namely an area with the SOC of 20% to 95%, in the voltage differentiation curve shown in FIG. 5b can be called as a platform area 530. In the platform area 530, the area with the SOC of 25% to 50% and the area with the SOC of 60% to 95% are particularly gentle parts of the voltage differentiation curve, so that the area with the SOC of 25% to 50% can be called as a first platform area 531, and the area with the SOC of 60% to 95% can be called as a second platform area 532. In some embodiments, the first platform area 531 and the second platform area 532 can be continuous areas with voltage differentiation values less than a certain preset value, and the preset value can be very close to 0. In some embodiments, the first platform area 531 can be a continuous area with the voltage differentiation value in the voltage differentiation curve less than a first preset value, and the second platform area 532 can be a continuous area with the voltage differentiation value in the voltage differentiation curve less than a second preset value. The first preset value and the second preset value can be the same as each other or different from each other.

According to the embodiment of the present application, in the process of determining the voltage differentiation curve, the SOC-OCV curve of the lithium iron phosphate battery is differentiated to obtain the corresponding voltage differentiation curve, so that a point with relatively large voltage distinction degree can be acquired in a large platform area range in the middle section, and it is taken as the chance for correcting the SOC of the battery to realize dynamic correction for the SOC.

According to some embodiments, the preset state of charge interval can include a first state of charge interval below the first platform area, the first platform area is a continuous area with the voltage differentiation value in the voltage differentiation curve less than the first preset value, and the correction point can include the first correction point.

Figure 6:
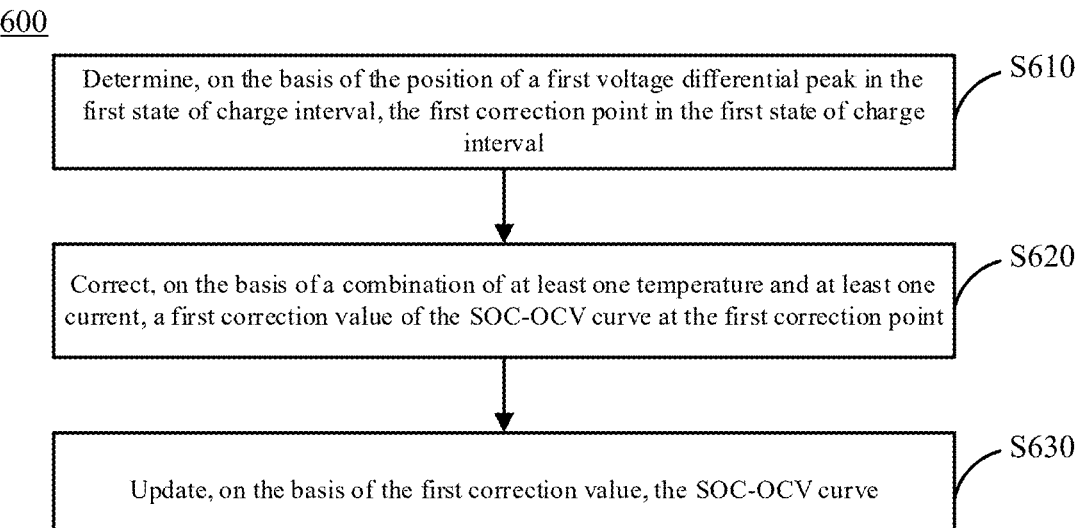
FIG. 6 is a flowchart of a process of performing correction at a first correction point according to an embodiment of the present application.

FIG. 6 is a flowchart of a process 600 of performing correction at a first correction point according to an embodiment of the present application. As shown in FIG. 6, the process 600 of performing correction at the first correction point may include S610: determining, on the basis of the position of a first voltage differentiation peak in the first state of charge interval, the first correction point in the first state of charge interval. The process 600 of performing correction at the first correction point can be, for example, in combination with step S420 shown in FIG. 4.

Step S610: Determine, on the basis of the position of a first voltage differentiation peak in the first state of charge interval, the first correction point in the first state of charge interval.

In an example, it is to be understood in combination with FIG. 5b, the preset state of charge interval can include a first state of charge interval 533 on the left side of the first platform area 531, and the correction point can include a first correction point 541. The first correction point 541 can be a point with the maximum voltage differentiation value in the continuous area (such as the whole first state of charge interval 533) with the maximum voltage differentiation value change amplitude in the first state of charge interval 533.

By determining the point with the maximum voltage differentiation value in the first state of charge interval 533 as the first correction point 541, the correction value can be determined at the position with the voltage distinction degree as large as possible, thereby improving the correction accuracy.

In some embodiments, the process 600 of performing correction at the first correction point can further include S620: calibrating, on the basis of the combination of at least one temperature and at least one current, a first correction value of the SOC-OCV curve at the first correction point; and S630: updating, on the basis of the first correction value, the SOC-OCV curve.

Step S620: Calibrate, on the basis of the combination of at least one temperature and at least one current, a first correction value of the SOC-OCV curve at the first correction point.

In an example, on the basis of the temperature, current and voltage corresponding to the first correction point, the first correction value can be determined by the SOC correction table on the basis of the combination of temperature and current.

Step S630: Update, on the basis of the first correction value, the SOC-OCV curve.

According to the embodiment of the present application, in process of performing correction at the first correction point, the SOC-OCV curve is corrected on the basis of the first point in the first state of charge interval, and then the correction value can be determined at the position with the voltage distinction degree as large as possible, thereby improving the correction accuracy.

According to some embodiments, the preset state of charge interval includes a second state of charge interval between the first platform area and the second platform area, the correction point includes a second correction point, and the second platform area is a continuous area with the voltage differentiation value in the voltage differentiation curve less than the preset value.

Figure 7:
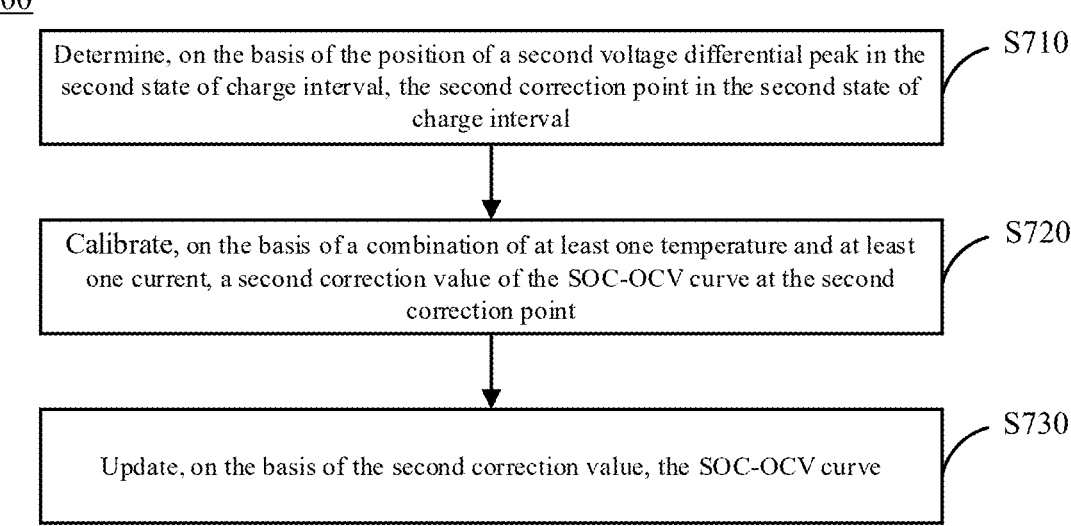
FIG. 7 is a flowchart of a process of performing correction at a second correction point according to an embodiment of the present application.

FIG. 7 is a flowchart of a process 700 of performing correction at a second correction point according to an embodiment of the present application. As shown in FIG. 7, the process 700 of performing correction at the second correction point may include S710: determining, on the basis of the position of the second voltage differentiation peak in the second state of charge interval, the second correction point in the second state of charge interval. The process 700 of performing correction at the second correction point can be, for example, in combination with step S420 shown in FIG. 4.

Step S710: Determine, on the basis of the position of the second voltage differentiation peak in the second state of charge interval, the second correction point in the second state of charge interval.

In an example, it is to be understood in combination with FIG. 5*b*, the preset state of charge interval can further include a second state of charge interval 534 between the first platform area 531 and the second platform area 532, and the correction point can include a second correction point 542. The second correction point 542 can be a point with the maximum voltage differentiation value in the continuous area (such as the whole second state of charge interval 534) with the maximum voltage differentiation value change amplitude in the second state of charge interval 534.

By determining the point with the maximum voltage differentiation value in the second state of charge interval 534 as the second correction point 542, an effective correction value can be further added at the position with the voltage distinction degree as large as possible, thereby improving the correction accuracy.

In some embodiments, the process 700 of performing correction at the second correction point may further include S720: calibrating, on the basis of the combination of at least one temperature and at least one current, a second correction value of the SOC-OCV curve at the second correction point; and S730: updating, on the basis of the second correction value, the SOC-OCV curve.

Step S720: Calibrate, on the basis of the combination of at least one temperature and at least one current, a second correction value of the SOC-OCV curve at the second correction point.

In an example, on the basis of the temperature, current and voltage corresponding to the second correction point, the second correction value can be determined by the SOC correction table on the basis of the combination of temperature and current.

Step S730: Update, on the basis of the second correction value, the SOC-OCV curve.

According to the embodiment of the present application, in the process of performing correction at the second correction point, the SOC-OCV curve is corrected on the basis of the second correction point in the second state of charge interval, and the effective correction value can be further added at the position with the voltage distinction degree as large as possible, thereby improving the correction accuracy.

It is to be understood that the SOC-OCV curve can be corrected only at the first correction point, or the SOC-OCV curve can be corrected only at the second correction point, or the SOC-OCV curve can be corrected at both the first correction point and the second correction point. Under the condition that the SOC-OCV curve is corrected twice at the first correction point and the second correction point, the SOC-OCV curve can be corrected at the first correction point and then subjected to secondary correction at the second correction point, or the SOC-OCV curve can be corrected at the second correction point and then subjected to secondary correction at the first correction point, or the SOC-OCV curve can be corrected once at the first correction point and the second correction point at the same time.

According to some embodiments, the method for estimating a state of charge of a lithium iron phosphate battery can further include: determining, on the basis of the temperature of the current time period and the current of the current time period, an SOC value corresponding to the current voltage in the updated SOC-OCV curve.

According to the method for estimating a state of charge of a lithium iron phosphate battery in the embodiment of the present application, by determining the SOC value corresponding to the current voltage in the updated SOC-OCV curve, the estimated state of charge of the lithium iron phosphate battery in the current time period can be closer to the true value, and thus, the use safety and service life of the battery can be improved and prolonged.

In another aspect, the present application also provides an apparatus for estimating a state of charge of a lithium iron phosphate battery.

Figure 8A:
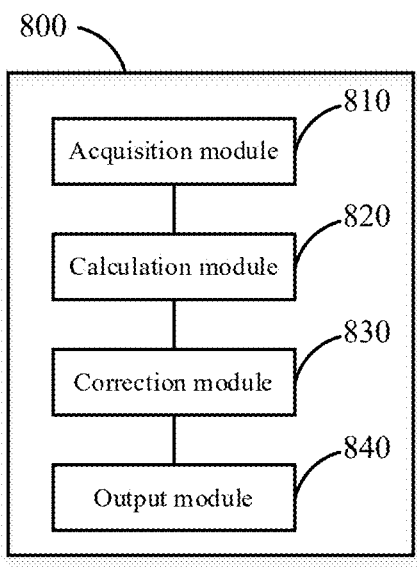
FIG. 8a is a structural block diagram of an apparatus for estimating a state of charge of a lithium iron phosphate battery according to an embodiment of the present application.

FIG. 8*a* is a structural block diagram of an apparatus 800 for estimating a state of charge of a lithium iron phosphate battery according to an embodiment of the present application.

As shown in FIG. 8*a*, the apparatus 800 for estimating a state of charge of a lithium iron phosphate battery includes: an acquisition module 810 configured to acquire the temperature of the current time period and an SOC-OCV curve under the current of the current time period; a calculation module 820 configured to determine, on the basis of the state of charge of the SOC-OCV curve, a correction point of the SOC-OCV curve; and a correction module 830 configured to correct, on the basis of a combination of at least one temperature and at least one current, the SOC-OCV curve at the correction point, and update the SOC-OCV curve.

The acquisition module 810, the calculation module 820 and the correction module 830 in the apparatus 800 for estimating a state of charge of a lithium iron phosphate battery correspond to steps 110, 120 and 130 in FIG. 1*a* respectively, so each aspect will not be detailed here.

In some embodiments, the apparatus 800 for estimating a state of charge of a lithium iron phosphate battery and the included modules may further include subunits, which will be further described below in combination with FIG. 8*b* and FIG. 8*c*.

According to the embodiment of the present application, the SOC-OCV curve is corrected at the correction point in the SOC-OCV curve of the lithium iron phosphate battery, so that the estimation precision of the state of charge of the lithium iron phosphate battery is improved, and as a result, the working state, the service life and the safety performance of the battery are ensured.

Figure 8B:
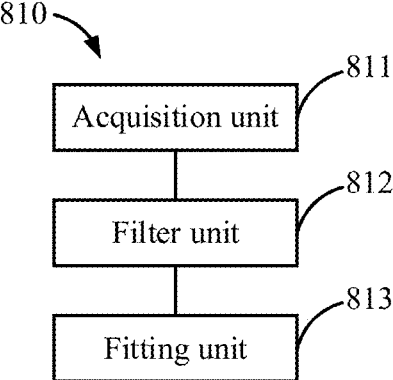
FIG. 8b is a structural block diagram of an acquisition module according to an embodiment of the present application.

FIG. 8*b* is a structural block diagram of an acquisition module 810 according to an embodiment of the present application.

In one embodiment, the acquisition module 810 may include: an acquisition module 811 configured to acquire the temperature and the voltage under the current; a filter unit 812 configured to filter the current and the voltage to obtain the current and voltage after noise reduction; and a fitting unit 813 configured to obtain the SOC-OCV curve according to the basis of the current and voltage after noise reduction.

In one embodiment, the acquisition unit is further configured to acquire current of at least the previous time period and voltage of at least the previous time period; and the filter unit is further configured to fuse the current of the current time period and the current of at least the previous time period to determine the current after noise reduction, and fuse the voltage of the current time period and the voltage of at least the previous time period to determine the voltage after noise reduction.

Figure 8C:
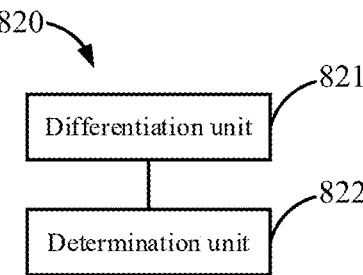
FIG. 8c is a structural block diagram of a calculation module according to an embodiment of the present application.

FIG. 8c is a structural block diagram of a calculation module 820 according to an embodiment of the present application.

In one embodiment, the calculation module 820 may include: a differentiating unit 821 configured to differentiate the SOC-OCV curve to determine a voltage differentiation curve; and a determination unit 822 configured to determine, on the basis of a voltage differentiation peak of the voltage differentiation curve in a preset state of charge interval, the correction point.

In one embodiment, the differentiating unit 821 is further configured to acquire a fixed voltage increment and a time increment corresponding to the fixed voltage increment, and differentiate, on the basis of the fixed voltage increment and the time increment, the SOC-OCV curve to determine the voltage differentiation curve.

In one embodiment, the preset state of charge interval can include a first state of charge interval under a first platform area, the correction point can include a first correction point, and the first platform area is a continuous area with a voltage differentiation value in the voltage differentiation curve less than a first preset value. The determination unit 822 is further configured to determine, on the basis of the position of a first voltage differentiation peak in the first state of charge interval, the first correction point in the first state of charge interval.

In one embodiment, the correction module 830 is further configured to calibrate, on the basis of the combination of at least one temperature and at least one current, a first correction value of the SOC-OCV curve at the first correction point, and update, on the basis of the first correction value, the SOC-OCV curve.

In one embodiment, the preset state of charge interval can include a second state of charge interval between the first platform area and a second platform area, the correction point can include a second correction point, and the second platform area is a continuous area with a voltage differentiation value in the voltage differentiation curve less than a second preset value. The determination unit 822 is further configured to determine, on the basis of the position of a second voltage differentiation peak in the second state of charge interval, the second correction point in the second state of charge interval.

In one embodiment, the correction module 830 is further configured to calibrate, on the basis of the combination of at least one temperature and at least one current, a second correction value of the SOC-OCV curve at the second correction point; and update, on the basis of the second correction value, the SOC-OCV curve.

In one embodiment, the apparatus 800 for estimating a state of charge of a lithium iron phosphate battery further includes: an output module 840 configured to determine, on the basis of the temperature of the current time period and the current of the current time period, an SOC value corresponding to the current voltage in the updated SOC-OCV curve.

In another aspect, the present application also provides an electronic device which includes a memory and a processor, in which, the memory is configured to store computer-executable instructions; and the processor is configured to access the memory and execute the computer-executable instructions to implement a detection method in any one of the above embodiments.

In one embodiment, the processor may be an integrated circuit chip having a signal processing capability. In implementation, each step of the above method embodiment can be completed by an integrated logic circuit of hardware in the processor or instructions in a form of software. The above-mentioned processor can be a general-purpose processor, a Digital Signal Processor (DSP), an Application Specific Integrated Circuit (ASIC), an Field-Programmable Gate Array (FPGA) or other programmable logic devices, discrete gate or transistor logic devices, discrete hardware components. Each method, step and logical block diagram disclosed in the embodiment of the present disclosure may be realized or executed. The universal processor can be a microprocessor or the processor can also be any conventional processor and the like. The steps of the method disclosed in conjunction with the embodiments of the present application can be directly embodied as being performed by the hardware decoding processor or being performed with a combination of hardware and software modules in the decoding processor. The software module may be located in a random access memory, a flash memory, a read-only memory, a programmable read-only memory, or an electrically erasable programmable memory, a register, or the like mature storage media in the art. The storage medium is located in a memory, and the processor reads information in the memory and completes the steps in the above method in combination with hardware of the processor.

In one embodiment, the memory can be a volatile memory or a non-volatile memory, or can include both the volatile memory and the non-volatile memory. The non-volatile memory may be a read-only memory (ROM), a programmable ROM (PROM), an erasable PROM (EPROM), an electrically erasable EPROM (EEPROM), or a flash memory. The volatile memory may be a Random Access Memory (RAM), which is used as an external cache. By way of example and not limitation, many forms of RAMs are available, such as Static RAM (SRAM), Dynamic RAM (DRAM), Synchronous DRAM (SDRAM), Double Data Rate SDRAM (DDR SDRAM), Enhanced SDRAM (ES-DRAM), Synchlink DRAM (SLDRAM), and Direct Rambus RAM (DR RAM). It is to be noted that the memories in the system and method described herein includes, but is not limited to, these and any other appropriate types of memory.

In another aspect, the present application also provides a computer-readable storage medium on which a computer program is stored, and the computer program is executed by a processor to implement the method in any one of the above embodiments.

In another aspect, the present application also provides a computer program product which includes a computer-readable code, or a nonvolatile computer-readable storage medium carrying the computer-readable code; and when the computer-readable code runs in an electronic device, a processor in the electronic device implements the method in any one of the above embodiments.

It is to be understood that although all steps in the flowchart involved in each embodiment are sequentially displayed according to the indication of each arrow, these steps are not necessarily executed in sequence according to the indication of the arrows. Unless there is a clear description here, the execution of these steps is not strictly limited in sequence, and these steps can be executed in other sequences. Moreover, at least a part of steps in the flowchart involved in each embodiment can include a plurality of steps or a plurality of stages, which are not necessarily executed and completed at the same moment but can be executed at different moments, and the execution sequence of these steps or these stages is not necessarily carried out in sequence but can be alternately or alternately executed with other steps of at least a part of steps or stages in other steps.

According to one embodiment of the present application, the state of charge of the lithium iron phosphate battery can be estimated by the following method.

Firstly, the temperature, current and voltage of the lithium iron phosphate battery at each sampling time point can be acquired at the fixed sampling frequency in the whole time period from charging to full charging of the lithium iron phosphate battery when the state of charge is 0. For the current and voltage of each sampling point, the current and voltage can be filtered by fusing the current and the voltage of the previous sampling point on the basis of the current filter formula I(k)=e*I(k)+(1−e)*I(k−1) and the voltage filter formula V(k)=f*V(k)+(1−f)*V(k−1) respectively. In the current filter formula and the voltage filter formula, I represents the current, V represents the voltage, k represents the current time sequence characteristic, e and f represent the weight coefficients and can be 0.9 for example. On the basis of the current and voltage after noise reduction obtained by the filtering processing, the SOC-OCV curve of the lithium iron phosphate battery can be determined, for example, the SOC-OCV curve shown in FIG. 1b.

Then, differential processing for time can be performed on the voltage at each sampling point, for example, the voltage differentiation value VCR of each sampling point can be calculated according to a voltage differentiation formula VCR (k)=ΔV/Δt, ΔV can be set to be a fixed voltage increment of 5 mV, and Δt represents the time increment corresponding to ΔV. On the basis of the voltage differentiation value of each sampling point obtained by the differential processing, the voltage differentiation curve of the lithium iron phosphate battery can be determined, for example, the voltage differentiation curve shown in FIG. 5b.

In the determined voltage differentiation curve of the lithium iron phosphate battery, the gentle middle area can be determined as the preset state of charge interval. In the preset state of charge interval, two particularly gentle areas can be determined as the first platform area and the second platform area respectively. The area below the first platform area in the preset state of charge interval can be determined as the first state of charge interval, and the area between the first platform area and the second platform area can be determined as the second state of charge interval.

Then, the point corresponding to the voltage differentiation peak in the first state of charge interval can be determined as the first correction point, and the point corresponding to the voltage differentiation peak in the second state of charge interval can be determined as the second correction point. Corresponding temperature, current and voltage can be acquired at the positions of the first correction point and the second correction point, and the SOC-OCV curve can be corrected at the positions of the first correction point and the second correction point on the basis of the data so as to update the SOC-OCV curve.

In the updated SOC-OCV curve, the SOC value corresponding to the current voltage can be acquired according to the current temperature and current so as to act as the estimated state of charge of the lithium iron phosphate battery.

Finally, it is to be noted that the above embodiments are only used for illustrating the technical solutions of the present application, not to limit them, and although the present application is described in detail with reference to the foregoing embodiments, those of ordinary skill in the art should understand that it may still modify the technical solutions described in the foregoing embodiments, or replace some or all of the technical features therein, and these modifications or substitutions do not make the essence of the corresponding technical solutions out of the scope of the technical solutions of the embodiments of the present application, and they should be covered by the scope of the claims and description of the present application. In particular, the technical features mentioned in the various embodiments can be combined in any manner as long as there is no structural conflict. The present application is not limited to the specific embodiments disclosed herein, but includes all technical solutions that fall within the scope of the claims.

What is claimed is:

1. A computer-implemented method for controlling a state of charge of a lithium iron phosphate battery, the method comprising:

providing a lithium iron phosphate battery;

with a voltage sensor, a temperature sensor and a current sensor coupled to the lithium iron phosphate battery and to a computer, acquiring the temperature of the current time period and an SOC-OCV curve under the current of the current time period;

with the computer, determining, on the basis of the state of charge of the SOC-OCV curve, a correction point of the SOC-OCV curve; and with the computer, correcting, on the basis of a combination of at least one temperature and at least one current, the SOC-OCV curve at the correction point, and updating the SOC-OCV curve; and with the computer, estimating a state of charge of the lithium iron phosphate battery by determining a SOC value corresponding to a current voltage in the updated SOC-OCV curve; and with the computer, controlling a change of the state of charge of the lithium iron phosphate battery as a function of the estimated state of charge;

wherein the determining, on the basis of the state of charge of the SOC-OCV curve, a correction point of the SOC-OCV curve comprises:

with the computer, differentiating the SOC-OCV curve to determine a voltage differentiation curve; and with the computer, determining, on the basis of a voltage differentiation peak of the voltage differentiation curve in a preset state of charge interval, the correction point.

2. The method for controlling a state of charge of a lithium iron phosphate battery according to claim 1, wherein the acquiring the temperature of the current time period and an SOC-OCV curve under the current of the current time period comprises:

acquiring the temperature of the current time period and the voltage of the current time period under the current of the current time period;

filtering the current of the current time period and the voltage of the current time period, and determining the current and voltage after noise reduction; and determining, on the basis of the current and voltage after noise reduction, the SOC-OCV curve.

3. The method for controlling a state of charge of a lithium iron phosphate battery according to claim 2, wherein the filtering the current of the current time period and the voltage of the current time period, and determining the current and voltage after noise reduction comprises:

acquiring current of at least the previous time period and voltage of at least the previous time period;

fusing the current of the current time period and the current of at least the previous time period to determine the current after noise reduction; and fusing the voltage of the current time period and the voltage of at least the previous time period to determine the voltage after noise reduction.

4. The method for controlling a state of charge of a lithium iron phosphate battery according to claim 1, wherein the differentiating the SOC-OCV curve to determine a voltage differentiation curve comprises:

acquiring a fixed voltage increment and a time increment corresponding to the fixed voltage increment; and differentiating, on the basis of the fixed voltage increment and the time increment, the SOC-OCV curve to determine the voltage differentiation curve.

5. The method for controlling a state of charge of a lithium iron phosphate battery according to claim 1, wherein the preset state of charge interval comprises a first state of charge interval under a first platform area, the correction point comprises a first correction point, and the first platform area is a continuous area with a voltage differentiation value in the voltage differentiation curve less than a first preset value; and the determining, on the basis of the voltage differentiation peak of the voltage differentiation curve in a preset state of charge interval, the correction point comprises:

determining, on the basis of the position of a first voltage differentiation peak in the first state of charge interval, the first correction point in the first state of charge interval.

6. The method for controlling a state of charge of a lithium iron phosphate battery according to claim 5, wherein the correcting, on the basis of a combination of at least one temperature and at least one current, the SOC-OCV curve at the correction point, and updating the SOC-OCV curve comprises:

calibrating, on the basis of the combination of at least one temperature and at least one current, a first correction value of the SOC-OCV curve at the first correction point; and updating, on the basis of the first correction value, the SOC-OCV curve.

7. The method for controlling a state of charge of a lithium iron phosphate battery according to claim 5, wherein the preset state of charge interval comprises a second state of charge interval between the first platform area and a second platform area, the correction point comprises a second correction point, and the second platform area is a continuous area with a voltage differentiation value in the voltage differentiation curve less than a second preset value; and the determining, on the basis of the voltage differentiation peak of the voltage differentiation curve in a preset state of charge interval, the correction point comprises:

determining, on the basis of the position of the second voltage differentiation peak in the second state of charge interval, the second correction point in the second state of charge interval.

8. The method for controlling a state of charge of a lithium iron phosphate battery according to claim 7, wherein the correcting, on the basis of a combination of at least one temperature and at least one current, the SOC-OCV curve at the correction point, and updating the SOC-OCV curve comprises:

calibrating, on the basis of the combination of at least one temperature and at least one current, a second correction value of the SOC-OCV curve at the second correction point; and updating, on the basis of the second correction value, the SOC-OCV curve.

9. The method for controlling a state of charge of a lithium iron phosphate battery according to claim 1, further comprising:

determining, on the basis of the temperature of the current time period and the current of the current time period, an SOC value corresponding to the current voltage in the updated SOC-OCV curve.

10. An electronic device, a memory and a processor, wherein the memory is configured to store computer programs which can run in a processor, and the processor executes the programs to implement the method according to claim 1.

11. A non-transitory computer-readable storage medium, on which a computer program is stored, wherein the computer program is executed by a processor to implement the method according to claim 1.

12. A computer implemented method for controlling a state of charge of a lithium iron phosphate battery, the method comprising:

providing a lithium iron phosphate battery;

with a voltage sensor, a temperature sensor and a current sensor coupled to the lithium iron phosphate battery and to a computer, acquiring the temperature of the current time period and an SOC-OCV curve under the current of the current time period;

with the computer, determining, on the basis of the state of charge of the SOC-OCV curve, a correction point of the SOC-OCV curve;

with the computer, correcting, on the basis of a combination of at least one temperature and at least one current, the SOC-OCV curve at the correction point, and updating the SOC-OCV curve; and with the computer, estimating a state of charge of the lithium iron phosphate battery by determining a SOC value corresponding to a current voltage in the updated SOC-OCV curve; and with the computer, controlling a change of the state of charge of the lithium iron phosphate battery as a function of the estimated state of charge;

wherein the acquiring the temperature of the current time period and an SOC-OCV curve under the current of the current time period comprises:

with the voltage sensor, temperature sensor and current sensor, acquiring the temperature of the current time period and the voltage of the current time period under the current of the current time period;

with the computer, filtering the current of the current time period and the voltage of the current time period, and determining the current and voltage after noise reduction; and with the computer, determining, on the basis of the current and voltage after noise reduction, the SOC-OCV curve.

13. The method for controlling a state of charge of a lithium iron phosphate battery according to claim 12, wherein the filtering the current of the current time period and the voltage of the current time period, and determining the current and voltage after noise reduction comprises:

acquiring current of at least the previous time period and voltage of at least the previous time period;

fusing the current of the current time period and the current of at least the previous time period to determine the current after noise reduction; and fusing the voltage of the current time period and the voltage of at least the previous time period to determine the voltage after noise reduction.

* * * * *